US008776002B2

(12) United States Patent
Formato

(10) Patent No.: US 8,776,002 B2
(45) Date of Patent: Jul. 8, 2014

(54) VARIABLE $Z_0$ ANTENNA DEVICE DESIGN SYSTEM AND METHOD

(75) Inventor: Richard A. Formato, Harwich, MA (US)

(73) Assignee: Variable Z0, Ltd., Harwich, MA (US)

(*) Notice: Subject to any disclaimer, the term of this patent is extended or adjusted under 35 U.S.C. 154(b) by 0 days.

(21) Appl. No.: 13/602,513

(22) Filed: Sep. 4, 2012

(65) Prior Publication Data

US 2012/0331436 A1 Dec. 27, 2012

Related U.S. Application Data

(60) Provisional application No. 61/531,237, filed on Sep. 6, 2011.

(51) Int. Cl.
| | | |
|---|---|---|
| *G06F 17/50* | (2006.01) | |
| *H01L 35/00* | (2006.01) | |
| *H01L 29/12* | (2006.01) | |
| *H01Q 1/00* | (2006.01) | |
| *H01Q 1/36* | (2006.01) | |
| *H03K 17/92* | (2006.01) | |
| *H04B 7/185* | (2006.01) | |
| *H04B 7/14* | (2006.01) | |
| *G06F 17/11* | (2006.01) | |
| *G06F 17/15* | (2006.01) | |

(52) U.S. Cl.
CPC ........ *G06F 17/5072* (2013.01); *G06F 17/5081* (2013.01); *G06F 17/5004* (2013.01); *G06F 17/11* (2013.01); *G06F 17/15* (2013.01); *H01L 35/00* (2013.01); *H01L 29/12* (2013.01); *H01Q 1/00* (2013.01); *H01Q 1/36* (2013.01); *H03K 17/92* (2013.01); *H04B 7/185* (2013.01); *H04B 7/14* (2013.01); *Y10S 439/916* (2013.01)
USPC ........... 716/132; 716/111; 716/122; 716/123; 716/129; 716/130; 716/136; 703/2; 703/16; 343/700 R; 375/315; 439/916; 455/13.3; 455/19; 505/201

(58) Field of Classification Search
CPC ............ G06F 17/5072; G06F 17/5081; G06F 17/5004; G06F 17/11; G06F 17/15; H01L 35/00; H01L 39/12; H01Q 1/00; H01Q 1/36; H03K 17/92; H04B 7/185; H04B 7/14
USPC ......... 703/2, 16; 343/700; 375/315; 439/916; 455/13.3, 19; 505/201; 716/132, 111, 716/122, 123, 129, 130, 136
See application file for complete search history.

(56) References Cited

U.S. PATENT DOCUMENTS 3,618,107 A * 11/1971 Spanos .......................... 343/773
3,858,221 A * 12/1974 Harrison et al. ............... 343/815
(Continued)

FOREIGN PATENT DOCUMENTS

JP 2001085931 A * 3/2001 ............. H01Q 11/08
JP 2008251358 A * 10/2008

OTHER PUBLICATIONS

NN7208973, "Circular Antenna for Electromagnetic Susceptibility", IBM Technical Disclosure Bulletin, vol. 15, No. 3, 1 Aug. 1972, p. 973 (2 pages).*

(Continued)

*Primary Examiner* — Phallaka Kik
(74) *Attorney, Agent, or Firm* — Iandiorio Teska & Coleman, LLP

(57) ABSTRACT

A variable $Z_0$ impedance method ("Variable $Z_0$") for designing and/or optimizing antenna systems. The method provides that the value of an antenna's feed system characteristic impedance or apparatus internal impedance ($Z_0$) changes as a true variable quantity during the antenna system design or optimization methodology. The value is allowed to be determined by the methodology, because different values of $Z_0$ result in different antenna system performance. It is applied to any set of performance objectives on any antenna system wherein apparatus internal or transmission line characteristic impedance is an explicit or implicit parameter. Variable $Z_0$ is applied to any design or optimization methodology. Structures include Yagi-Uda arrays, Meander Monopoles, and transmission line Multi-Stub Matching Networks, and can incorporate Central Force Optimization or Biogeography Based Optimization or other optimization algorithms.

8 Claims, 13 Drawing Sheets

REPRESENTATIVE ANTENNA SYSTEM DESIGN
FLOWCHART INTEGRATING VARIABLE Z0

(56) References Cited

U.S. PATENT DOCUMENTS

| | | | |
|---|---|---|---|
| 4,207,574 A * | 6/1980 | Toia | 343/752 |
| 4,259,673 A * | 3/1981 | Guretzky | 343/825 |
| 4,370,660 A | 1/1983 | Fahmy | |
| 4,518,965 A * | 5/1985 | Hidaka | 343/742 |
| 4,630,064 A * | 12/1986 | Andrews et al. | 343/895 |
| 5,572,170 A * | 11/1996 | Collins et al. | 333/32 |
| 5,719,794 A * | 2/1998 | Altshuler et al. | 703/1 |
| 5,835,067 A | 11/1998 | Goodman | |
| 6,259,930 B1 | 7/2001 | Bae | |
| 6,346,913 B1 * | 2/2002 | Chang et al. | 343/700 MS |
| 6,628,241 B1 * | 9/2003 | Fukushima et al. | 343/895 |
| 6,642,903 B2 * | 11/2003 | Schantz | 343/795 |
| 6,693,597 B2 | 2/2004 | Walton et al. | |
| 6,697,031 B2 | 2/2004 | Jocher | |
| 7,180,467 B2 | 2/2007 | Fabrega-Sanchez et al. | |
| 7,898,493 B1 * | 3/2011 | Rojas et al. | 343/850 |
| 7,913,198 B2 | 3/2011 | Holter | |
| 8,008,982 B2 | 8/2011 | McKinzie, III | |
| 8,111,205 B1 * | 2/2012 | Tam et al. | 343/788 |
| 8,154,459 B2 | 4/2012 | Teshima et al. | |
| 8,159,404 B2 | 4/2012 | Wakui | |
| 8,193,989 B2 | 6/2012 | Fujita et al. | |
| 8,594,584 B2 * | 11/2013 | Greene et al. | 455/77 |
| 8,599,093 B2 * | 12/2013 | Ridgeway | 343/860 |
| 8,626,083 B2 * | 1/2014 | Greene et al. | 455/77 |
| 2002/0082812 A1 * | 6/2002 | Yamaguchi et al. | 703/2 |
| 2005/0113952 A1 * | 5/2005 | Shimizu et al. | 700/97 |
| 2006/0125706 A1 * | 6/2006 | Amyotte et al. | 343/786 |
| 2006/0256027 A1 * | 11/2006 | Rawnick et al. | 343/861 |
| 2007/0040758 A1 * | 2/2007 | Dwyer et al. | 343/792 |
| 2007/0176834 A1 * | 8/2007 | Mohammadian et al. | 343/702 |
| 2008/0186245 A1 * | 8/2008 | Hilgers | 343/803 |
| 2008/0266191 A1 * | 10/2008 | Hilgers | 343/726 |
| 2009/0057302 A1 * | 3/2009 | Ben-Shmuel et al. | 219/748 |
| 2009/0107216 A1 * | 4/2009 | Lin et al. | 73/61.41 |
| 2011/0122043 A1 * | 5/2011 | Ridgeway | 343/860 |
| 2011/0148723 A1 * | 6/2011 | Bengtsson et al. | 343/745 |
| 2011/0279348 A1 * | 11/2011 | Hossain et al. | 343/895 |
| 2012/0295554 A1 * | 11/2012 | Greene et al. | 455/77 |
| 2012/0295555 A1 * | 11/2012 | Greene et al. | 455/77 |
| 2014/0049434 A1 * | 2/2014 | Greene et al. | 343/745 |

OTHER PUBLICATIONS

Babakhani et al., "Finding Globally Optimum Solutions in Antenna Optimization Problems", 2010 IEEE Antenna and Propagation Society, Jul. 11, 2010, pp. 1-4.*

* cited by examiner

ANTENNA SYSTEM IN TRANSMIT MODE

GENERALIZED ANTENNA SYSTEM IN TRANSMIT MODE

REPRESENTATIVE ANTENNA SYSTEM DESIGN
FLOWCHART INTEGRATING VARIABLE Z0

REPRESENTATIVE ANTENNA SYSTEM OPTIMIZATION
FLOWCHART INTEGRATING VARIABLE Z0

500

```
Procedure  CFO[f(x⃗), N_d, Ω]
```

Internals: $N_t$, $F_{rep}^{init}$, $\Delta F_{rep}$, $F_{rep}^{min}$, $\left(\frac{N_p}{N_d}\right)_{MAX}$, $\gamma_{start}$, $\gamma_{stop}$, $\Delta\gamma$.

Initialize $f_{max}^{global}(\vec{x}) =$ very large negative number, say, $-10^{+4200}$.

For $N_p/N_d = 2$ to $\left(\frac{N_p}{N_d}\right)_{MAX}$ by $2$:

(a.0)    Total number of probes: $N_p = N_d \cdot \left(\frac{N_p}{N_d}\right)$

For $\gamma = \gamma_{start}$ to $\gamma_{stop}$ by $\Delta\gamma$:

(a.1)   Re-initialize data structures for position/acceleration vectors & fitness matrix.
      (a.2)   Compute IPD [see text].
      (a.3)   Compute initial fitness matrix, $M_0^p, 1 \le p \le N_p$.
      (a.4)   Initialize $F_{rep} = F_{rep}^{init}$.

For $j = 0$ to $N_t$ [or earlier termination - see text]:

(b)    Compute position vectors, $\vec{R}_j^p, 1 \le p \le N_p$ [eq.(2)].
      (c)    Retrieve errant probes $(1 \le p \le N_p)$:

If $\vec{R}_j^p \cdot \hat{e}_i < x_i^{min} \therefore \vec{R}_j^p \cdot \hat{e}_i = \max\{x_i^{min} + F_{rep}(\vec{R}_{j-1}^p \cdot \hat{e}_i - x_i^{min}), x_i^{min}\}$.

If $\vec{R}_j^p \cdot \hat{e}_i > x_i^{max} \therefore \vec{R}_j^p \cdot \hat{e}_i = \min\{x_i^{max} - F_{rep}(x_i^{max} - \vec{R}_{j-1}^p \cdot \hat{e}_i), x_i^{max}\}$.

(d)    Compute fitness matrix for current probe distribution, $M_j^p, 1 \le p \le N_p$.
      (e)    Compute accelerations using current probe distribution and fitnesses [eq. (1)].
      (f)    Increment $F_{rep}$: $F_{rep} = F_{rep} + \Delta F_{rep}$; If $F_{rep} > 1 \therefore F_{rep} = F_{rep}^{min}$.
      (g)    If $j \ge 20$ and $j\, MOD\, 10 = 0 \therefore$ (i)  Shrink Ω around $\vec{R}_{best}$ [see text].
         (ii) Retrieve errant probes [procedure Step (c)].

Next $j$ (h)    Reset Ω boundaries [values before shrinking].
      (i)     If $f_{max}(\vec{x}) \ge f_{max}^{global}(\vec{x}) \therefore f_{max}^{global}(\vec{x}) = f_{max}(\vec{x})$.

Next $\gamma$

Next $N_p/N_d$

<div style="text-align:center">Central Force Optimization (CFO) Pseudocode</div>

CENTRAL FORCE OPTIMIZATION PSEUDOCODE

FIG. 5

6-ELEMENT YAGI VSWR

6-ELEMENT YAGI FORWARD GAIN

6-ELEMENT YAGI FRONT-TO-BACK RATIO

MEANDER MONOPOLE ANTENNA SYSTEM VSWR

MEANDER MONOPOLE ANTENNA SYSTEM MAXIMUM GAIN

1200

US 8,776,002 B2

VARIABLE Z₀ ANTENNA DEVICE DESIGN SYSTEM AND METHOD

RELATED APPLICATION

This application claims the benefit of U.S. Provisional Application No. 61/531,237 filed Sep. 6, 2011, incorporated herein by reference in its entirety for all purposes.

COPYRIGHT NOTICE

A portion of the disclosure of this patent document contains material that is subject to copyright protection. The copyright owner has no objection to the facsimile reproduction by anyone of the patent document or the patent disclosure, as it appears in a published Patent and Trademark Office patent file or record, but otherwise reserves all copyrights whatsoever.

FIELD OF THE INVENTION

The invention relates to a system and method for creating antenna devices by providing parameters of their fabrication.

BACKGROUND OF THE INVENTION

Antennas, the devices that emit (radiate) and receive electromagnetic radiation, have become progressively more important in the modern world. Even though many, if not most, antennas today are "invisible," literally out-of-sight because they are imbedded in other devices, their numbers are ever increasing in all manner of wireless machines ranging from cell phones, to laptop computers, to M2M (machine-to-machine) devices as representative examples, not an exhaustive list. In many cases antenna performance limits how well its associated device works. Oftentimes the limitation is bandwidth-related, which may constrain data rates or throughput, thereby limiting, for example, how quickly an image might display or a web page takes to load. The limitation also may relate to some other antenna performance measure, or combination thereof, such as, for example, radiation pattern or efficiency, sidelobe level, and so on, as representative not exhaustive. Industry experts point out that progressively better antennas are required to meet modern communication requirements. As an example, demand for bandwidth is projected to more than triple year over year, and there is consensus that better antennas are a key element in meeting it. (See "Mobile bandwidth crunch causing concern for innovation, extra pay" by Jim Shakenbach, Mass High Tech Magazine, Wednesday, Jul. 6, 2011, at pp. 8-9 (print edition), published by American City Business Journals.

Traditional design or optimization ("D/O") paradigms, methods, techniques, algorithms, frameworks, approaches, processes, or procedures (collectively and individually hereinafter "methodology") view the antenna feed system characteristic impedance or the apparatus internal impedance, denoted herein $Z_0$, as a fixed parameter with a constant value specified at the start of the methodology, even if multiple parametric values are employed. $Z_0$ therefore is not a variable quantity whose value is determined by the methodology. This distinction is subtle but extremely important, because traditional methodology automatically excludes from the outset all antenna system configurations that could provide better performance by using some other value of $Z_0$.

What is needed is a system and method that provides antenna devices with improved performance specifications, including, but not limited to, impedance bandwidth (IBW). Variable $Z_0$ System and Method addresses this need.

SUMMARY OF THE INVENTION

Embodiments include a system and method for designing an antenna system comprising wherein an antenna feed system characteristic impedance or apparatus internal impedance is treated as a variable quantity whose value is determined by a design methodology of the antenna system, instead of its being specified as a fixed design parameter.

Another embodiment includes a system and method for optimizing an antenna system comprising wherein an antenna feed system characteristic impedance or apparatus internal impedance is treated as a variable quantity whose value is determined by an antenna system optimization methodology, instead of its being specified as a fixed optimization parameter.

An embodiment is a variable impedance method and system for designing an antenna system comprising varying an input value of the impedance of an antenna feed system of the antenna system to produce a selected value of the impedance; determining the selected value of the impedance by a methodology; wherein the input value of the impedance of the antenna system is not specified as a fixed design parameter; and applying to an antenna system the design of the antenna system that fulfills specified characteristics. Another embodiment includes defining electromagnetic characteristics of the antenna system other than the impedance; specifying ranges of the electromagnetic characteristics; and calculating parameter values of the antenna system from the specified electromagnetic characteristics other than the impedance. In a further embodiment, the antenna feed system impedance is an antenna feed system characteristic impedance. For a yet further embodiment, the antenna feed system impedance comprises an antenna feed system internal impedance. In still further embodiments, the methodology comprises a design methodology. For yet other embodiments, the methodology comprises an optimization methodology. In additional embodiments, minimum and maximum values are specified for the variable impedance. In still other embodiments, minimum and maximum values are specified for the electromagnetic characteristics of the antenna system other than the impedance. Continuing embodiments provide that the electromagnetic characteristics comprise design parameters. In an ongoing embodiment, the electromagnetic characteristics comprise optimization parameters. Subsequent embodiments provide that the methodology comprises at least one of the group consisting of a deterministic algorithm, Central Force Optimization (CFO), Dominating Cone Line Search (DCLS), extended Wu-King impedance loading, seat of the pants design, experience-based design, and best guess. Another following embodiment provides that the methodology comprises at least one of the group consisting of a stochastic algorithm, Particle Swarm Optimization (PSO), Ant Colony Optimization (ACO), Differential Evolution (DE), and Genetic Algorithm.

An embodiment is a variable impedance method for designing antenna systems comprising the steps of defining parameters of the antenna system, including a variable antenna feed system impedance; specifying ranges of the parameters, including a minimum value and a maximum value for the antenna feed system impedance; iteratively executing a methodology to calculate antenna system characteristics from the parameters including the variable antenna feed system impedance; selecting values for the antenna system parameters determined from the methodology. In another embodiment, the parameters of the antenna system comprise design parameters. In a further embodiment, the parameters of the antenna system comprise optimization parameters. For a yet further embodiment, the methodology includes performance objective iteration, the iteration comprising inputting initial performance objectives; executing a design methodology; determining if performance objectives have been met; modifying the initial performance objectives if the performance objectives have not been met, then re-executing the design methodology with the modified performance objectives; and ending the iteration if performance objectives have been met, selecting antenna system design parameters resulting in meeting the performance objectives. In still further embodiments, the methodology includes optimization iteration, the iteration comprising defining a fitness function; executing an optimization methodology; determining if termination criteria have been met; re-executing the optimization methodology if the termination criteria have not been met; and ending the iteration if the termination criteria have been met, selecting antenna system design parameters resulting in meeting the termination criteria. Other embodiments further comprise an external antenna modeling engine interfacing with the optimization methodology. Yet other embodiments, further comprise applying to an antenna system the design of the antenna system that fulfills specified characteristics including a determined value of the variable antenna feed system impedance.

An embodiment is one or more computer-readable storage media comprising computer-executable instructions for a variable impedance method for designing antenna systems, the computer-executable instructions directed to steps comprising defining parameters of the antenna system, including a variable antenna feed system impedance; specifying ranges of the parameters, including a minimum value and a maximum value for the antenna feed system impedance; iteratively executing a methodology to calculate antenna system characteristics from the parameters including the variable antenna feed system impedance; and selecting values for the antenna system parameters determined from the methodology.

BRIEF DESCRIPTION OF THE DRAWINGS

FIG. 5 is Central Force Optimization pseudocode.

DETAILED DESCRIPTION

Figure 1:
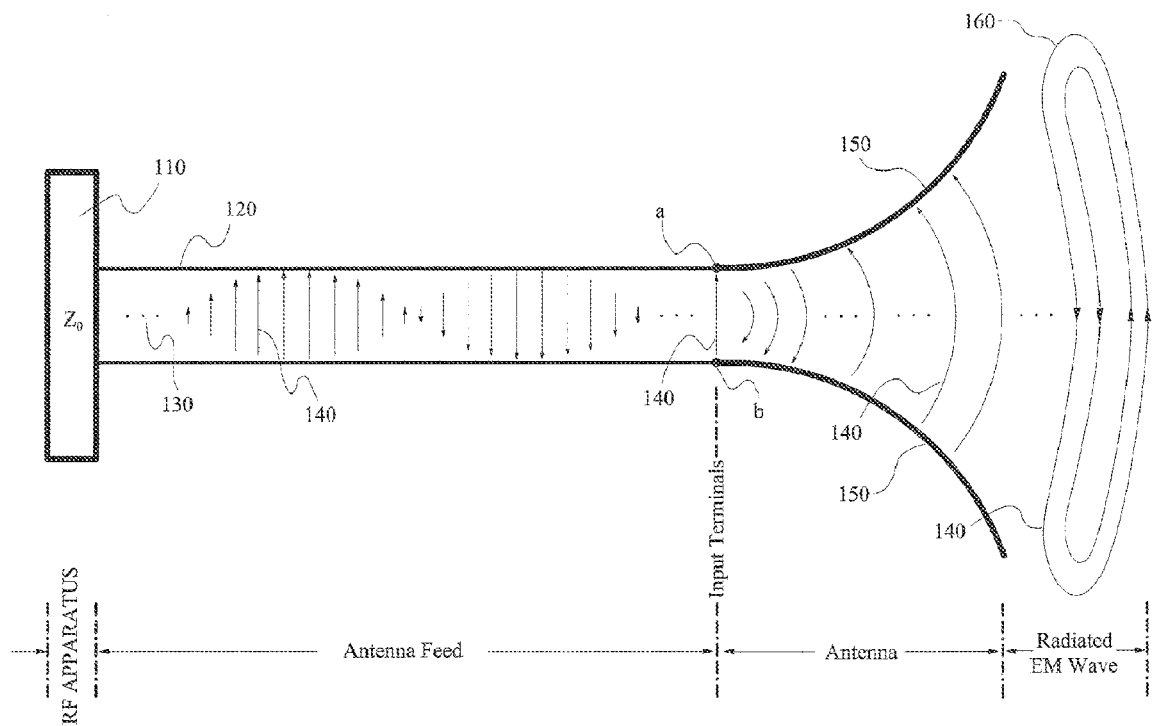
FIG. 1 is a schematic representation of an antenna system in transmit mode.

The invention is susceptible of many embodiments. What follows is illustrative, but not exhaustive, of the scope of the invention.

The Variable $Z_0$ System and Method disclosed herein mitigates many antenna limitations by departing dramatically from the traditional approach to antenna system design or optimization ("D/O"). The Variable $Z_0$ System and Method ("Variable $Z_0$") provides that the value of an antenna's feed system characteristic impedance or apparatus internal impedance (impedance of an antenna feed system), herein denoted $Z_0$, be allowed to change as a true variable quantity during the antenna system design or optimization methodology and whose value be allowed to be determined by the methodology, because different values of $Z_0$ result in different antenna system performance that often is considerably improved. Variable $Z_0$ removes the limitation of specifying a value for $Z_0$ in advance, and this invention yields unexpected benefits by doing so. The term "design" refers to specifying a complete set of antenna system parameters that meets minimum user-specified performance objectives or requirements, such as bandwidth, radiation pattern, and so on, as nonlimiting examples. The term "optimization" refers to specifying a complete set of antenna system parameters that best meets user-specified performance objectives or requirements, often but not necessarily formulated in a mathematical "fitness function" or "objective function" that is optimized using a computer algorithm. In the design setting, Variable $Z_0$ can achieve superior antenna system designs that are unattainable using traditional D/O methodology. This also is true in the optimization setting, in which multiple values of a variable $Z_0$ value, instead of fixed values for $Z_0$, for a "best" design may correspond to a single or to multiple global optima that may be discovered by using an optimization algorithm, which may be stochastic or deterministic, and which also may converge on local instead of global optima.

The Variable Z0 System and Method provides many advantages over traditional antenna D/O methodology. It can be applied without limitation to any antenna system design or optimization problem wherein Z0 is an explicit or implicit parameter against any set of performance goals or, in the case of optimization, against any fitness or objective function. Embodiments are especially useful for improving impedance bandwidth, as illustrated by the examples in this disclosure, but Variable Z0 is not limited to that application alone. Significantly, the Variable Z0 System and Method "product by process" approach also can be used in conjunction with any design or optimization methodology, deterministic ones like Central Force Optimization (CFO) or Dominating Cone Line Search (DCLS); stochastic algorithms like Particle Swarm Optimization (PSO), Ant Colony Optimization (ACO), Differential Evolution (DE), or Genetic Algorithm (GA); analytic approaches such as extended Wu-King impedance loading; even "seat of the pants" design or optimization based on experience, intuition, or even a "best guess." For additional discussion of impedance loading, see, as examples without limitation, R. A. Formato, "New Techniques for Increasing Antenna Bandwidth with Impedance Loading," Progress in Electromagnetics Research B, Vol. 29, 2011, pp. 269-288; and R. A. Formato, "Issues in Antenna Optimization—A Monopole Case Study," 2011, Cornell Univ. Library both of which are fully incorporated herein by reference.

The Variable Z0 System and Method, which treats Z0 as a design or optimization variable instead of a fixed parameter can be used with any design or optimization methodology, rendering it surprisingly flexible in its breadth of applicability. Because of this unexpected and unrestricted applicability, Variable Z0 embodiments are especially useful with algorithm-independent approaches in which various design or optimization algorithms can be used singly or in combination with others (see, for example, R. A. Formato, "Dynamic Threshold Optimization—A New Approach?" June 2012, Cornell University Library, which is fully incorporated herein by reference).

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter.

Embodiments disclose a novel and proprietary antenna system design or optimization System and Method called "Variable $Z_0$," $Z_0$ being the antenna feed system characteristic impedance or apparatus internal impedance (impedance of an antenna feed system). Design refers to the specification of a complete set of parameters that defines an antenna system meeting specific performance objectives. Optimization refers to the specification of a complete set of parameters that defines the antenna system best meeting specific performance objectives to the extent possible. Variable $Z_0$ embodiments are particularly useful for improving impedance bandwidth (IBW). In addition, Variable $Z_0$ embodiments are useful for meeting any performance objectives, even ones that do not consider IBW at all, for any antenna system for which $Z_0$ is a design or optimization parameter. $Z_0$ may be included as a parameter explicitly, for example without limitation, by utilizing one or the other or both of its real and imaginary parts (resistance and reactance, respectively), or implicitly, for example without limitation, as the reference impedance for computing a standing wave ratio.

FIG. 1 is a schematic representation of an antenna system 100 in transmit mode comprising: RF (radio-frequency) apparatus 110 with characteristic impedance or apparatus internal impedance (impedance of an antenna feed system) $Z_0$; antenna feed 120 that conducts RF energy shown as propagating electric field 140; antenna input terminals a and b; and antenna 150. The antenna system may function in transmit mode, receive mode (not shown), or both, and in each case antenna feed 120 typically is a transmission line or matching network or combination of the two. In transmit mode, RF apparatus 110 is a source of RF energy, typically a radio transmitter. The sequence of dots 130 denotes repetition of the electric field pattern. Antenna 150 is "That part of a transmitting or receiving system that is designed to radiate or to receive electromagnetic waves" as defined in IEEE Std 145-1993 *IEEE Standard Definitions of Terms for Antennas,* 1993 (definition 2.12 at page 4), published by The Institute of Electrical and Electronics Engineers, Inc. (IEEE), 345 East 47th Street, New York, N.Y. 10017-2394 USA (ISBN 1-55937-317-2), fully incorporated herein by reference. Terminology employed herein is intended to be consistent with this standard to the fullest extent. In transmit mode, antenna 150 emits into the surrounding space a radiated electromagnetic (EM) wave 160 comprising coupled electric and magnetic fields, which for simplicity is represented schematically only by its electric field 140. When the antenna system functions in receive mode radiated EM wave 160 is replaced by an incident EM wave, and RF apparatus 110 typically is a receiver. In many cases RF apparatus 110 comprises a transceiver that functions both as a transmitter and a receiver.

Figure 2:
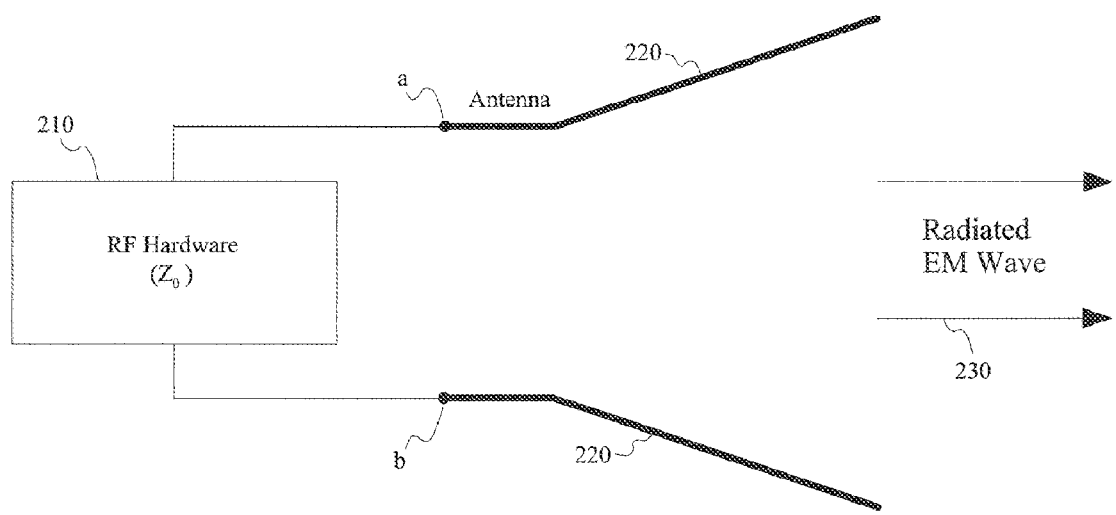
FIG. 2 is a schematic representation of a generalized antenna system in transmit mode.

FIG. 2 is a schematic representation 200 of a generalized antenna system in transmit mode in which RF hardware 210 incorporates elements 110 and 120 in FIG. 1. RF hardware 210 has a generalized complex apparatus internal impedance denoted $Z_0$, this nomenclature deriving from the fact that the RF apparatus 110 of FIG. 1 usually is impedance-matched to antenna feed 120 in FIG. 1 which typically is a transmission line with characteristic impedance $Z_0$. Hence the $Z_0$ nomenclature, which has no special significance beyond its being a common notation in the antenna art. In the context of this invention, $Z_0$ represents the internal impedance of RF hardware 210 in FIG. 2 regardless of the hardware's specific configuration or mode of operation (transmit, receive, or both), although, as pointed out above, $Z_0$ typically is a transmission line's characteristic impedance. These concepts are discussed more generally in the textbook "Antenna Theory: Analysis and Design," by C. A. Balanis, Harper & Row, Publishers, New York, 1982 ("Balanis") at pages 1-4 and 52-57, which is incorporated herein by reference. In particular, FIGS. 1 and 2 herein are adapted from Balanis FIGS. 1.1 and 2.18(a) in Sections 1.2 and 2.13, respectively, of that textbook; and $Z_0$ herein corresponds to internal impedance $Z_g$ in Balanis FIG. 2.18(a) and to $Z_T$ in Balanis FIG. 2.19(a). Additional discussion of antenna feed systems in the context of impedance bandwidth appears in Y. Zehforoosh, et al., "Antenna Design for Ultra Wideband Application Using a New Multilayer Structure," *PIERS Online*, vol. 2, No. 6, pp. 544-549, 2006, at page 546, which is fully incorporated herein by reference, doi:10.2529/PIERS060531145356, "doi" being the paper's "digital object identifier."

In transmit mode, RF hardware 210 in FIG. 2 excites antenna 220 at its input terminals a and b, and antenna 220 emits radiated EM wave 230 into the surrounding space. Maximum power is absorbed by antenna 220 when impedance $Z_0$ is conjugated-matched to the antenna input impedance $Z_{in}$ seen between terminals a and b; that is, there is zero reflected power when this condition is met (note that in Balanis' notation $Z_{in}$ is denoted $Z_A$ in his equation (2-72) at page 54). The antenna input impedance $Z_{in}$ is determined by the antenna's source current distribution. Constraining this current distribution to yield a value of antenna input impedance, $Z_{in}$, that is as close as possible to $Z_0$'s complex conjugate unnecessarily eliminates all other current distributions that will provide better antenna performance against a specific set of user-specified performance objectives with a different value of $Z_0$. This limitation, which is inherent in all traditional antenna D/O methodology, is removed by using the Variable $Z_0$ System and Method instead of traditional methodology, and the results often are quite surprising.

IBW is defined as the frequency band or bands within which $Z_{in}$, the antenna input impedance, is matched within specified limits to $Z_0$, the characteristic impedance or apparatus internal impedance of RF hardware 210 in FIG. 2. The required degree of matching can be specified in terms of the antenna's actual input impedance [resistance, $R_{in}$, and reactance, $X_{in}$, where $Z_{in}=R_{in}+jX_{in}$, $j=(-1)^{1/2}$] as a function of frequency, or, as is more often the case, in terms of a maximum voltage standing wave ratio (VSWR). IBW typically is specified as VSWR//$Z_0 \leq 2:1$ (// denoting "relative to"), which is equivalent to a return loss (scattering parameter $S_{11}$) approximately less than −10 dB. Other VSWR thresholds can be used instead, and frequently are. Zehforoosh et al., cited above, describe the design of an Ultra Wideband (UWB) microstrip antenna and provide a useful summary of $Z_0$'s significance as a design or optimization parameter in the context of IBW. Following traditional methodology, Zehforoosh's work treats the feed system characteristic impedance $Z_0$ as a fixed parameter, not a variable quantity as it is in Variable $Z_0$. While IBW is an important consideration in modern wireless device antenna system design, other performance measures often are as well, for example, without limitation, directivity, radiation pattern, sidelobe level, or radiation efficiency, which also can be addressed using the Variable $Z_0$ System and Method.

Figure 3:
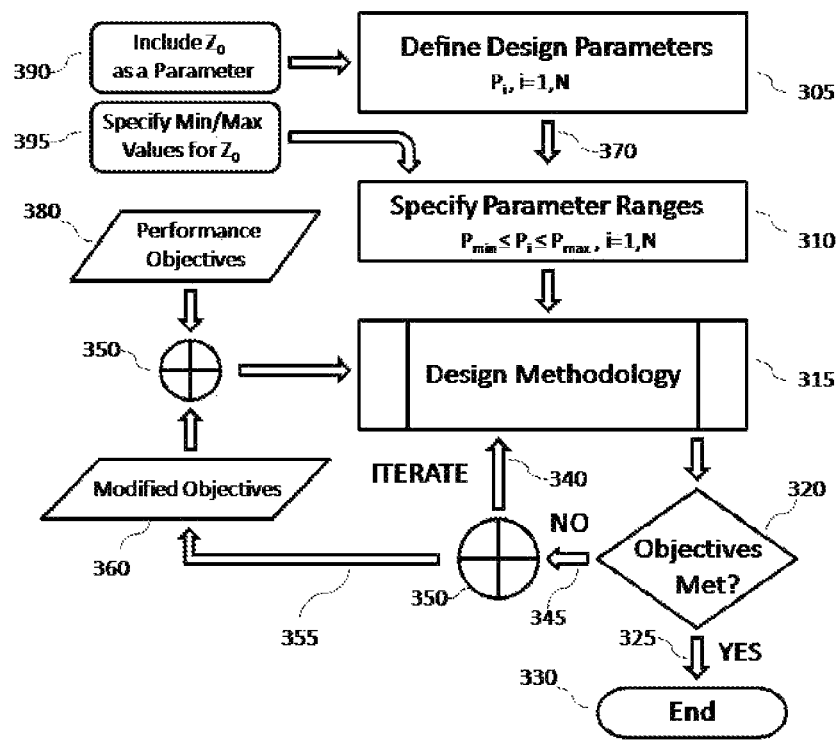
FIG. 3 is representative antenna system design flowchart showing Variable $Z_0$ System and Method configured in accordance with an embodiment of the invention.

FIG. 3 flowchart 300 is a representative antenna system design methodology illustrating a Variable Z0 embodiment including steps 390, 395. Flowchart 300 applies generally to any design methodology 315. As an example, without limitation, in the case of designing a Yagi-Uda array antenna system ("Yagi"), design methodology 315 might be based on the essentially graphical methodology formulated in P. B. Viezbicke, "Yagi Antenna Design," National Bureau of Standards Technical Note 688, U.S. Dept. of Commerce, December, 1976 which is fully incorporated herein by reference. Alternatively, design methodology 315 may be based on one of the many computer programs or textbooks available from or recommended by the American Radio Relay League (ARRL), 225 Main Street, Newington, Conn. 06111 USA, on its antenna technology website or, as an example, not a limitation, the various methods described in The ARRL Antenna Book.

In flowchart 300, arrows 370 trace the sequence of design steps, which begins with definition of design parameters 305, in which each of N parameters $P_i$, i=1, N, is defined. In the case of the Yagi array, for example, the length, diameter, and spacing of each array element are typical design parameters. For other types of antennas, other parameters may be specified. For example, a helical antenna might be defined by its number of turns, wire gauge, helix diameter, and turn pitch. These typical antenna types and parameters are provided for illustrative purposes only, in no way limiting the types of antennas or the range of antenna system parameters that may be designed or determined using the Variable $Z_0$ System and Method according to this invention.

In step 310, each antenna system design parameter typically is bounded by minimum and maximum acceptable values, that is, $P_{min} \leq P_i \leq P_{max}$, i=1, N, where $P_{min}$ and $P_{max}$, respectively, are the minimum and maximum acceptable values. These bounds define the antenna system "design space." For example, in the case of the Yagi array, the acceptable driven element length might be no shorter than 10 centimeters (minimum) and no longer than 50 centimeters (maximum), while similarly in the helix example, the number of turns might be restricted to no fewer than 5 or more than 20, these examples being provided only for purposes of illustration and not in any way limiting the Variable $Z_0$ System and Method according to this invention.

Design methodology 315 processes the design parameters to develop an antenna system design whose performance is evaluated against a set of user-specified performance objectives shown as input data 380 or 360 feeding design methodology 315. Performance objectives 380 or modified performance objectives 360 pass through OR function 350 as shown. If the design objectives are met in decision step 320 then the design methodology 315 is terminated at End step 330. If, on the other hand, objectives 380 are not met, path 345, then the objectives may be preserved and another iteration 340 of the design methodology undertaken using the original performance objectives 380. Alternatively, as shown in OR step 350, the objectives may be modified by following path 355 to create modified performance objectives 360, whereupon OR 350 is performed to input new modified performance objectives to design methodology 315. The process outlined in flowchart 300 continues until an acceptable antenna system design has been developed. Modifications to representative flowchart 300 often are made by practitioners skilled in the art of antenna system design, and such modifications are fully anticipated herein.

Introducing $Z_0$ as a new design parameter results in better antenna system designs because the design space has been expanded by introducing into it another degree of freedom, namely, the variable instead of fixed value of $Z_0$. Steps 390 and 395 create an entirely new range of possible antenna source current distributions, which, without Variable $Z_0$, are forever inaccessible using traditional methodology, and which, with Variable $Z_0$, can result in improved antenna system performance. These new distributions often result in remarkably better antenna performance, the possible tradeoff then being between working with a "non-standard" value for $Z_0$ and achieving a much better antenna system, or insisting on a pre-determined "standard" value for $Z_0$ at the expense of performance. This trade-off generally favors the Variable $Z_0$ design, often by a very wide margin.

Figure 4:
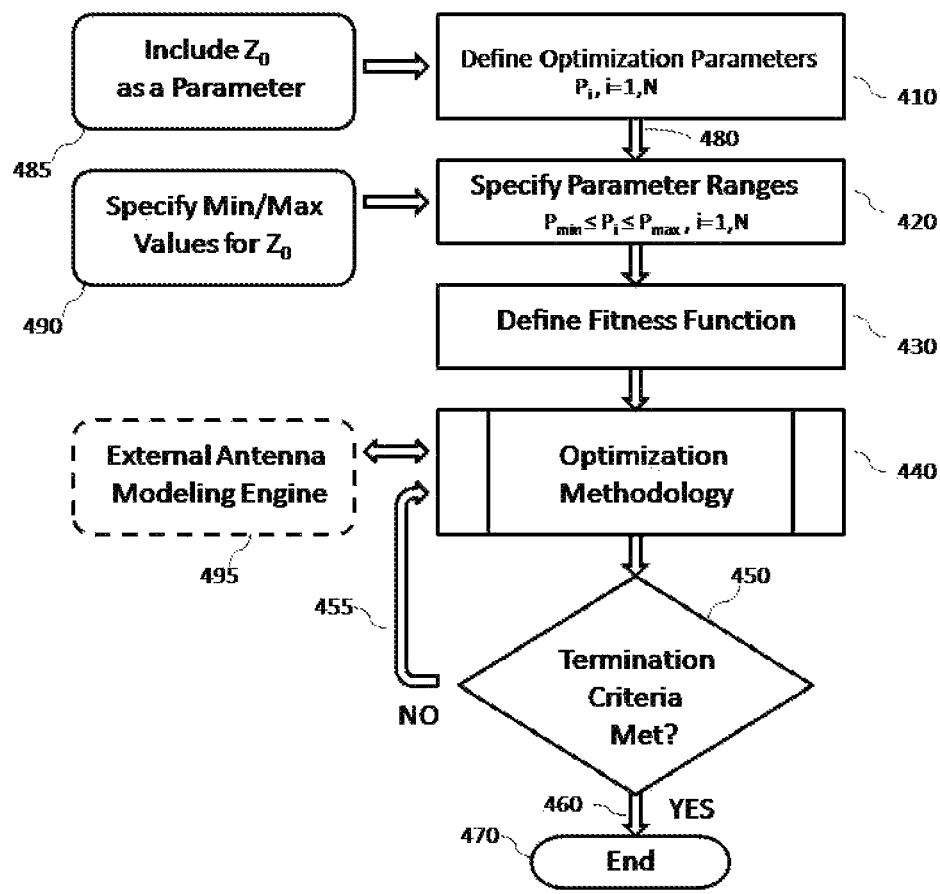
FIG. 4 is a representative antenna system optimization flowchart showing Variable $Z_0$ System and Method configured in accordance with an embodiment of the invention.

FIG. 4 flowchart 400 is a representative antenna system optimization methodology illustrating a Variable Z0 embodiment including steps 485, 490. Flowchart 400 applies generally to any optimization methodology 440. Optimization methodology 440 is completely unrestricted as to type and function, and it may perform maximization or minimization. It may be computer-based, which most often is the case, or analytical in nature, or a combination of these or other approaches, for example without limitation, graphical, approaches. Widely used computer search and optimization algorithms include, as examples and not limitations, Central Force Optimization, Dominating Cone Line Search, Particle Swarm Optimization, Genetic Algorithm, Ant Colony Optimization, Differential Evolution, and many others well known in the art. For additional discussion of antenna system optimization algorithms, see, for example, without limitation, E. A. Jones et al., "Design of Yagi-Uda Antennas Using Genetic Algorithms," IEEE Trans. Antennas and Propagation, vol. 45, no. 9, 1997, pp. 1386-1392; R. A. Formato, "Improved CFO Algorithm for Antenna Optimization," Prog. Electromagnetics Research B, Vol. 19, 2010, pp. 405-425; R. A. Formato, "Central Force Optimization Applied to the PBM Suite of Antenna Benchmarks," 2010, each of which is fully incorporated herein by reference.

Flowchart 400 begins with definition of optimization parameters 410 followed by specification of the "decision space" 420 by bounding these parameters (steps 410 and 420 are analogous to steps 305 and 310 in FIG. 3) and by definition of the fitness function to be optimized 430, which may be maximized or minimized.

Whereas design methodology 315 in flowchart 300 usually comprises a capability to assess antenna system performance, as a general rule optimization methodology 440 does not. Most optimization algorithms are "stand alone" computer programs that are useful across a wide range of disparate problems, not only antenna system design. As an example, Ant Colony Optimization has been used for array antenna synthesis (see, for example, Quevedo-Teruel et al., "Ant Colony Optimization for Array Synthesis," IEEE Antennas and Propagation Society International Symposium, 23 Oct. 2006, Albuquerque, N. Mex., pp. 3301-3304, doi: 10.1109/APS.2006.1711318, which is fully incorporated herein by reference), and also for solving protein folding problems, which is a quite different discipline (see, for example, Hu et al., "Protein Folding in Hydrophobic-Polar Lattice Model: A Flexible Ant-Colony Optimization Approach," Protein & Peptide Letters, 2008, 15, 469-477, which is fully incorporated herein by reference).

Because optimization methodology 440 typically does not comprise an antenna system modeling capability, an optional external antenna modeling engine 495 usually is required (but not necessarily, with the dashed line being used to distinguish blocks 485 and 490). Many modeling engines are available, and one of the most popular is the Numerical Electromagnetics Code (NEC), which is available in several versions. NEC-2, for example, is freeware downloadable from various websites.

NEC has been used to compute Yagi array and Meander Monopole antenna system performance using an embodiment of Variable $Z_0$ System and Method, and the results are described below. Details of NEC theory, implementation, and use may be found in the following publications: G. J. Burke, "Numerical Electromagnetics Code—NEC-4.2 Method of Moments, Part I: User's Manual," Jul. 15, 2011, LLNL-SM-490875; G. J. Burke, "Numerical Electromagnetics Code—NEC-4, Method of Moments, Part I: User's Manual and Part II: Program Description—Theory," January 1992, UCRL-MA-109338; G. J. Burke and A. J. Poggio, "Numerical Electromagnetics Code (NEC)—Method of Moments," Parts I, II and III, January 1981, UCID-19934, all published by Lawrence Livermore National Laboratory, Livermore, Calif., USA.

Optimization methodology 440 continues to operate until user-specified termination criteria 450 are met, whereupon path 460 is followed to termination step 470. If, however, termination criteria 450 are not met, then path 455 is followed, and optimization methodology 440 continues its operation. Typical termination criteria are a certain number of iterations (often referred to as "generations" or "steps"); saturation of a fitness function (changes over some number of steps within a specified tolerance); meeting or exceeding a specific fitness threshold value; or a combination of these and possibly other measures of how "good" the value of the fitness function is. The user is free to define whatever termination criterion or criteria, respectively, is or are appropriate, singly or in combination with others. Modifications to this representative flowchart 400 often are made by practitioners skilled in the art of antenna system design, and such modifications are fully anticipated herein.

In some example embodiments of the Variable $Z_0$ System and Method, the Central Force Optimization (CFO) algorithm has been used as optimization methodology 440, and FIG. 5 provides CFO pseudocode 500. Procedure CFO[$f(\vec{x})$, $N_d$, $\Omega$] optimizes (maximization, not minimization) a scalar-valued function $f(\vec{x})$ of $N_d$-dimensional decision vector $$\vec{x} = \sum_{i=1}^{N_d} x_i \hat{e}_i,$$

where $\hat{e}_i$ is the $i^{th}$ unit vector in the decision space defined by $\Omega=\{x_i | x_i^{min} \leq x_i \leq x_i^{max}, i=1,\ldots,N_d\}$. N is the number of CFO "time" steps; $F_{rep}^{init}$ the starting value for CFO's repositioning factor $F_{rep}$; $\Delta F_{rep}$ the increment in $F_{rep}$; $F_{rep}^{min}$ its minimum value; $N_p$ the number of CFO probes;

$$\left(\frac{N_p}{N_d}\right)_{MAX}$$

the maximum number of CFO probes per dimension; and $\gamma_{start}, \gamma_{stop}, \Delta\gamma$, respectively, CFO's $\gamma$-parameter starting, stopping, and increment values for CFO's probe line distribution. As an optimization run progresses, CFO computes a fitness matrix $M_j^p$ at each probe's location specified by position vector $\vec{R}_j^p$, j being the time step index and p the probe number. Pseudocode 500 has been reproduced from R. A. Formato, "Parameter-Free Deterministic Global Search with Simplified Central Force Optimization," in Advanced Intelligent Computing Theories and Applications (ICIC2010), Lecture Notes in Computer Science (D.-S. Huang, Z. Zhao, V. Bevilacqua and J. C. Figueroa, Eds.), LNCS 6215, pp. 309-318, Springer-Verlag Berlin Heidelberg, 2010, which contains a detailed explanation of the CFO algorithm and which is fully incorporated herein by reference. Additional explanation of CFO theory and operation appears in R. A. Formato, "Central Force Optimization with Variable Initial Probes and Adaptive Decision Space," *Applied Mathematics and Computation*, Vol. 217, 2011, pp. 8866-8872, and in R. A. Formato, "Central Force Optimization: A New Metaheuristic with Applications in Applied Electromagnetics," *Prog. Electromagnetics Research*, PIER 77, 2007, pp. 425-491, both of these publications being fully incorporated herein by reference.

FIGS. 6 through 13, inclusive, illustrate the improvement in antenna system performance achievable by using the Variable $Z_0$ System and Method with three quite different example systems: (1) a 6-element Yagi-Uda array antenna system; (2) a Meander Monopole antenna system; and (3) a transmission line Multi-Stub Matching Network.

6-Element Yagi-Uda Array Results

A Yagi array usually comprises a single reflector element (REF), a single driven element (DE), and a plurality of director elements ($D_i$) all arranged parallel to one another along a perpendicular boom. If each element has the same circular cross-section, which often is the case, then the array is completely specified by assigning to each element a length and its spacing from the previous one. For example, a 6-element Yagi is completely specified by 11 geometrical parameters (six lengths for REF, DE, $D_1$, $D_2$, $D_3$, $D_4$; and five spacings for DE-REF, $D_1$-DE, $D_2$-$D_1$, $D_3$-$D_2$, $D_4$-$D_3$). These parameters and others used in specifying an antenna system typically are termed "design" or "optimization" "parameters" or "variables" or "decision variables," or, depending on context, other like terminology which is common in the art and anticipated herein.

In traditional antenna system D/O methodology the impedance $Z_0$ is assigned a fixed value at the beginning of the methodology, typically $Z_0=50\Omega$ because this is a "standard" value. By contrast, using Variable $Z_0$ Method and System according to this invention, $Z_0$ is not assigned any value, and instead is allowed to "float" as a true variable quantity whose ultimate value is determined by the methodology. Thus, in applying a design or optimization methodology to the Variable $Z_0$ 6-element Yagi array antenna system, $Z_0$ is added to the list of design parameters as a twelfth design parameter or decision variable whose value is to be determined by the design or optimization methodology, an improvement that, surprisingly, has been overlooked through many decades of antenna system design or optimization.

Figure 6:
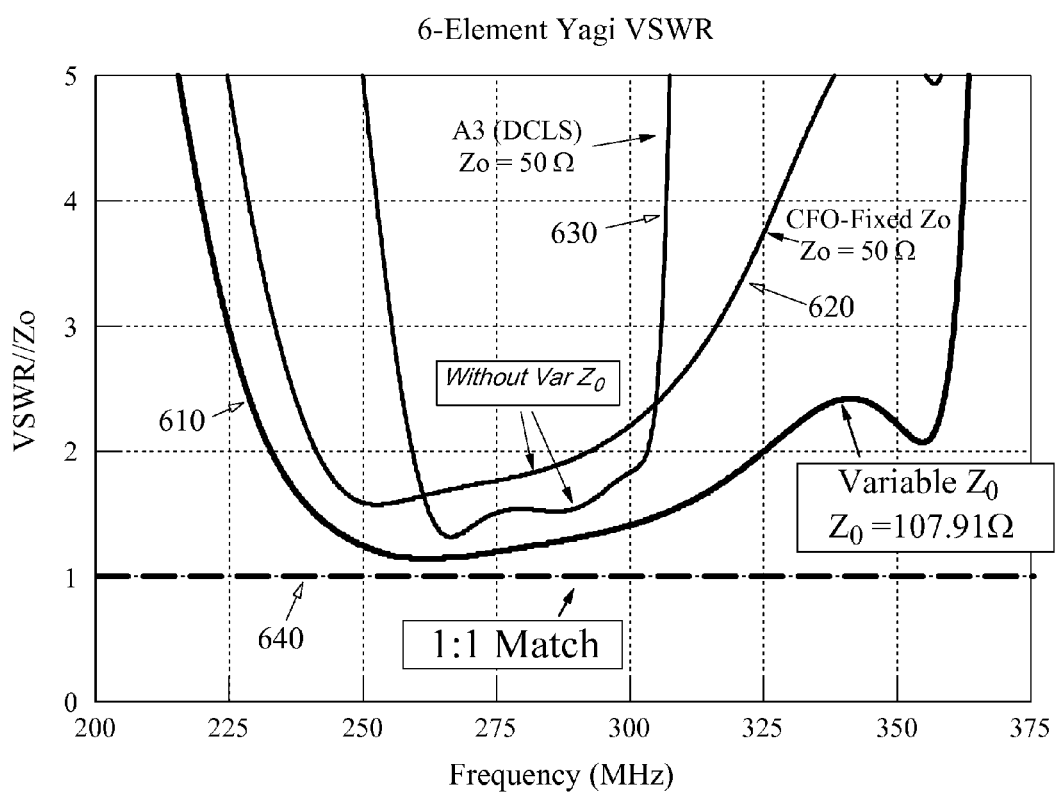
FIG. 6 is a graph of VSWR relative to $Z_0$ for a 6-element Yagi antenna system configured in accordance with an embodiment of the invention.
Figure 7:
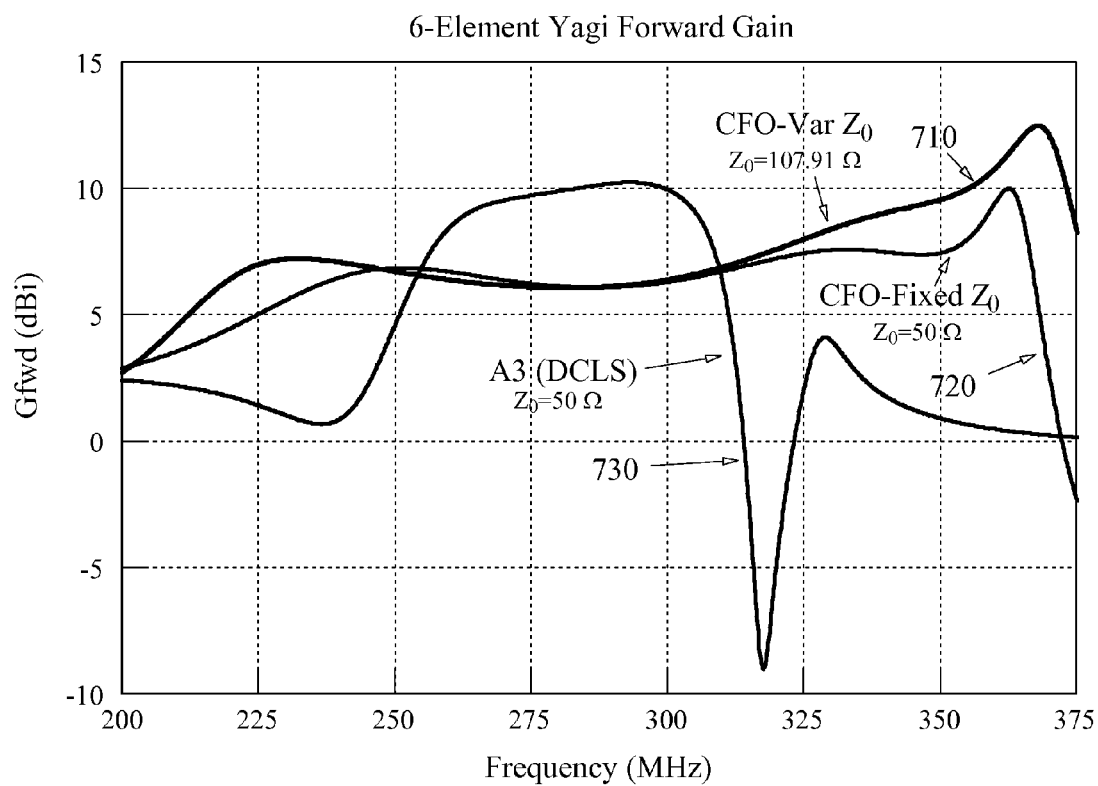
FIG. 7 is a graph of Forward Gain for a 6-element Yagi antenna system configured in accordance with an embodiment of the invention.
Figure 8:
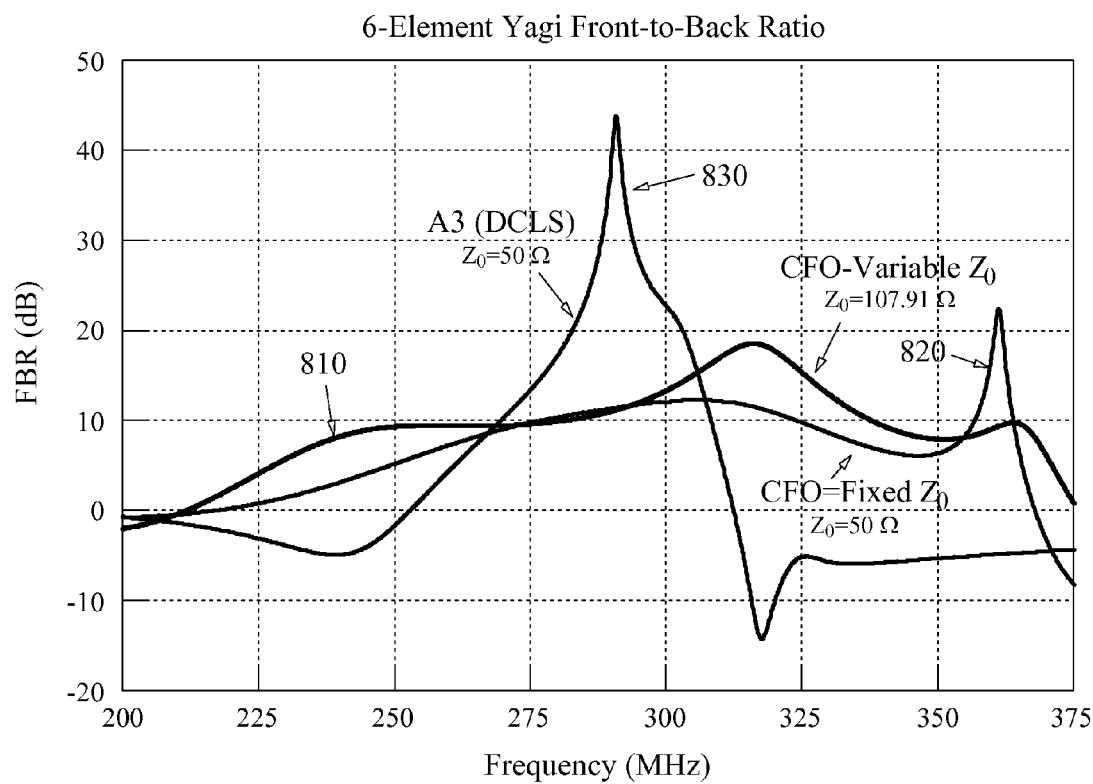
FIG. 8 is a graph of Front-to-Back Ratio for a 6-element Yagi antenna system configured in accordance with an embodiment of the invention.

FIGS. 6, 7 and 8, respectively, plot the Voltage Standing Wave Ratio (VSWR), Forward Gain ($G_{fwd}$), and Front-to-Back Ratio (FBR) for a 6-element Yagi optimized using traditional methodology, that is keeping $Z_0$ fixed, and also using the improved Variable $Z_0$ System and Method according to this invention. The traditional methodology assumed a "standard" value of 50Ω for $Z_0$ and used two different deterministic optimization algorithms: Central Force Optimization (CFO) and Dominating Cone Line Search (DCLS). For the Variable $Z_0$ case, $Z_0$ was treated as a true variable quantity according to this invention whose value is determined by the optimization algorithm (CFO), instead of being specified as a fixed value input to the algorithm.

DCLS and the fitness (objective) function that was used for a DCLS-optimized 6-element Yagi are described in A. C. Lisboa, et al., "Monotonically Improving Yagi-Uda Conflicting Specifications Using the Dominating Cone Line Search Method," *IEEE Trans. Magnetics*, vol. 45, no. 3, 2009, pp. 1494-1497, which is fully incorporated herein by reference.

For the CFO runs, the Yagi array antenna system was optimized against the fitness function $$\sum_{k=1}^{3} c_k \cdot G_{fwd}(f_k, \vec{x}) - \sum_{i=1}^{3} c_i \cdot VSWR // Z_0(f_i, \vec{x})$$

where $f$ is the antenna operating frequency and $\vec{x}$ the decision vector defined as $\vec{x} = (Z_0, L_{REF}, L_{DE}, L_{D_1}, L_{D_2}, L_{D_3}, L_{D_4}, X_{DE}, X_{D_1}, X_{D_2}, X_{D_3}, X_{D_4})$. The fitness function coefficients were:

| i | $c_i$ | k | $c_k$ | $f_{i,k}$ (MHz) |
|---|-----|---|-----|-----------------|
| 1 | 5.0 | 1 | 0.2 | 239.8 |
| 2 | 8.0 | 2 | 0.8 | 299.8 |
| 3 | 0.9 | 3 | 1.0 | 359.8 |

The fitness (to be maximized in this case) increases with increasing forward gain $G_{fwd}$ and decreasing $VSWR//Z_0$, $VSWR//Z_0$ being the voltage standing wave ratio relative to $Z_0$ (// denotes "relative to"). This fitness function optimizes the antenna system both for VSWR and for gain, not just one or the other, and it provides an example, without limitation, of how various antenna system performance measures can be combined. There are no restrictions on how a suitable objective or fitness function may be defined or what performance measures may be included. Yagi system performance in this case was computed using NEC as the modeling engine.

The 6-element Yagi antenna system optimization problem is 12-dimensional with the following decision variables: $Z_0$, the feed system characteristic impedance (or apparatus internal impedance if there is no feed line) according to this invention; and the eleven geometric variables corresponding to the Yagi element lengths ("L") and boom coordinates ("X"), each subscripted with the corresponding element name (note that REF is placed symmetrically on the Y-axis, that is, at X=0, in a rectangular Cartesian coordinate system). The fitness is evaluated at three frequencies using the empirically determined coefficients $c_i$ and $c_k$ shown above. $G_{fwd}$ is evaluated in the direction of the +X-axis (θ=90°, φ=0° in NEC's right-handed spherical polar coordinate system).

Additional details and discussion of this optimization example appear in R. A. Formato, "Improving Bandwidth of Yagi-Uda Arrays," *Wireless Engineering and Technology*, January 2012, 3, pp. 18-24 (doi:10.4236/wet.2012.31003), which is fully incorporated herein by reference.

FIG. 6 graph 600 shows that the Variable $Z_0$ 6-element Yagi VSWR 610 exhibits considerably better IBW for the usual VSWR threshold of 2:1, and, indeed, surprisingly better performance throughout the VSWR range than the traditional fixed-$Z_0$ systems 620, 630. This improvement is a result of allowing the optimization algorithm to determine $Z_0$ according to this invention, which in this case was found to be a value of 107.91Ω instead of the usual 50Ω that was used for the fixed-$Z_0$ antenna systems. Curve 630 was computed by NEC using the dimension data for the fixed-$Z_0$ 6-element DCLS-optimized "A3" Yagi array described in Lisboa et al.'s paper cited above. For comparative purposes, FIG. 6 also shows IBW for a "perfect antenna" (1:1 impedance match) as the dashed line 640.

FIGS. 7 and 8, graphs 700 and 800, similarly show that the CFO-optimized Variable Z0 Yagi curves 710, 810 exhibit generally better Gfwd and FBR, respectively, than the fixed Z0=50Ω antenna systems 720, 730, 820, 830. Additional details describing Variable Z0 and the CFO algorithm appear in R. A. Formato, "A Novel Methodology for Antenna Design and Optimization: Variable Z0 (ver. 2)," 2011 (Cornell University Library) and in R. A. Formato, "UWB Array Design Using Variable Z0 Technology and Central Force Optimization, ver. 2," 2011 Cornell University Library), both of which are fully incorporated herein by reference.

Meander Monopole Results

Figure 9:
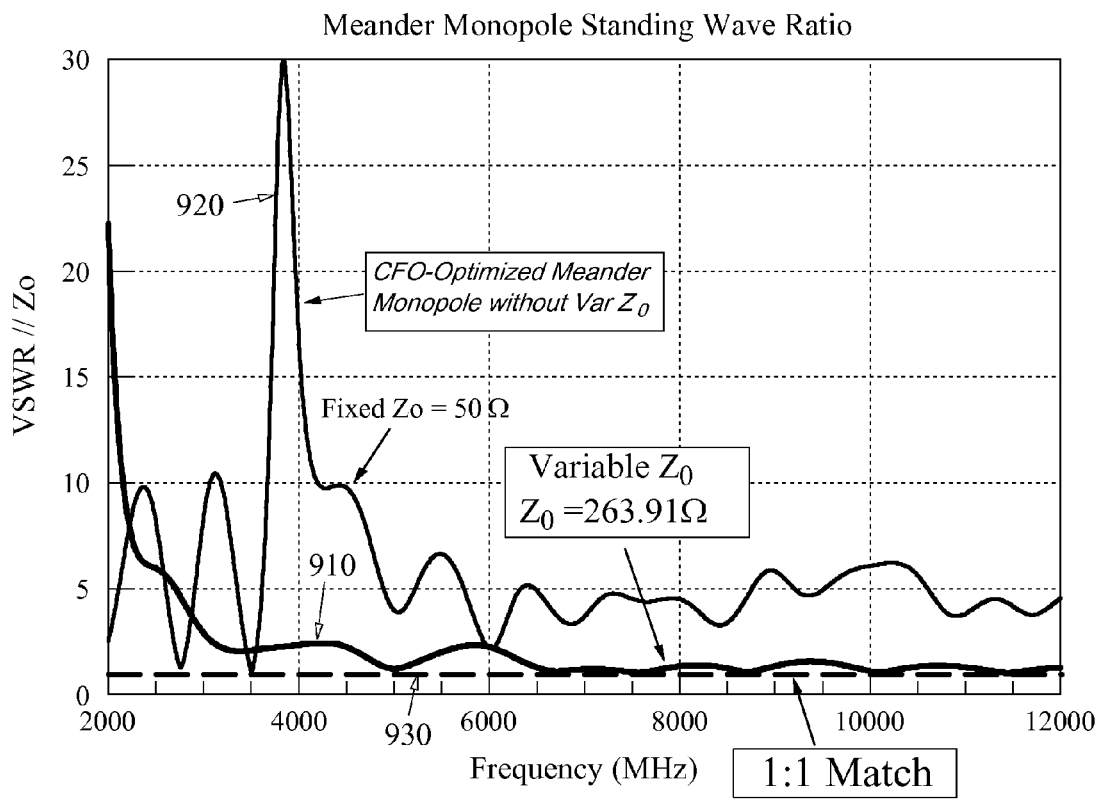
FIG. 9 is a graph of VSWR relative to $Z_0$ for a Meander Monopole antenna system configured in accordance with an embodiment of the invention.
Figure 10:
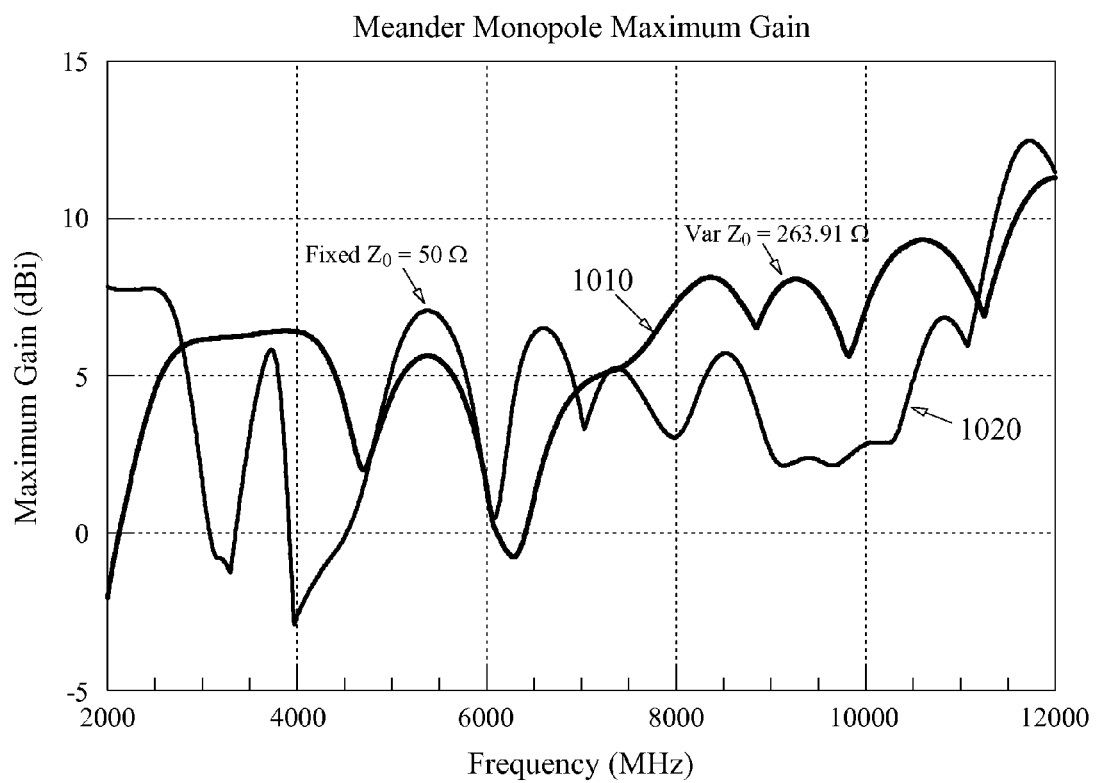
FIG. 10 is a graph of Maximum Gain for a Meander Monopole antenna system configured in accordance with an embodiment of the invention.

As a further example of Variable $Z_0$'s effectiveness, FIGS. 9 and 10, graphs 900 and 1000, respectively, show VSWR and maximum gain for a CFO-optimized Meander Monopole (MM) antenna system using Variable $Z_0$ (curves 910, 1010) and not using it (curves 920, 1020). The MM antenna system, like the Yagi example above, was optimized both for VSWR and maximum gain, but a different fitness function was employed, in this case, the weighted gain-VSWR quotient defined as $$\sum_{i=1}^{N} \frac{w_g(f_i) \cdot G_{max}(f_i)}{w_{VSWR}(f_i) \cdot VSWR // Z_0(f_i)}$$

wherein functions $$w_g(f_i) = \frac{(w_g^{max} - w_g^{min})(f_U - f_i)}{f_U - f_L} + w_g^{min}$$

and $$w_{VSWR}(f_i) = \frac{(w_{VSWR}^{max} - w_{VSWR}^{min})(f_U - f_i)}{f_U - f_L} + w_{VSWR}^{min}$$

are weighting functions, and $f_i$, $f_L$ and $f_U$ are the calculation frequencies and operating band lower and upper frequencies, respectively. A detailed discussion of this Meander Monopole optimization example appears in R. A. Formato, "Variable $Z_0$—A New Antenna Design Paradigm," *VHF Communications* (U.K.), January 2012, March, 2012, pp. 18-23, which is fully incorporated herein by reference.

It is seen from the curves in FIG. 9 that using the traditional methodology in which $Z_0$ is set to a fixed value (50Ω in this case) results in a higher and much more variable VSWR, 920, than does Variable $Z_0$ according to this invention, 910, in which the CFO optimization algorithm determines $Z_0$'s value. The difference in these curves is unexpectedly dramatic, especially when they are compared to the perfect 1:1 match curve 930.

As shown in the annotation of curve 910, an optimum value of $Z_0$ computed by CFO using the Variable $Z_0$ System and Method is 263.91Ω, which is quite different from the standard 50Ω value. Besides resulting in a VSWR curve 910 that is surprisingly flatter and closer to the ideal 1:1 curve, Variable $Z_0$ eliminates the very large and undesirable spike between 3500 and 4000 MHz on curve 920. Forcing the MM antenna system current distribution to impedance-match $Z_0$=50Ω to the greatest degree possible, which is what traditional antenna system D/O does, automatically excludes the far better current distribution discovered by CFO using Variable $Z_0$ which results in $Z_0$=263.91Ω.

FIG. 10 compares the MM antenna system's maximum gains and shows that across the band the Variable $Z_0$ gain 1010 generally is comparable to or better than the fixed $Z_0$ gain 1020. These data combined with curves 910 and 920 show clearly that the CFO-optimized MM antenna system using the Variable $Z_0$ System and Method according to this invention has accomplished the objective of improved VSWR while maintaining good maximum gain, and that this MM's performance is surprisingly better than that obtained with the traditional D/O approach in which $Z_0$ is a fixed parameter whose value cannot change. Variable $Z_0$ is effective because it adds another degree of freedom to the design space or, in the case of optimization, to the decision space, thereby leading to unexpected and surprisingly greater flexibility in discovering good solutions to the design or optimization problem, the MM problem described here being only an example.

Multi-Stub Matching Network Results

Figure 11:
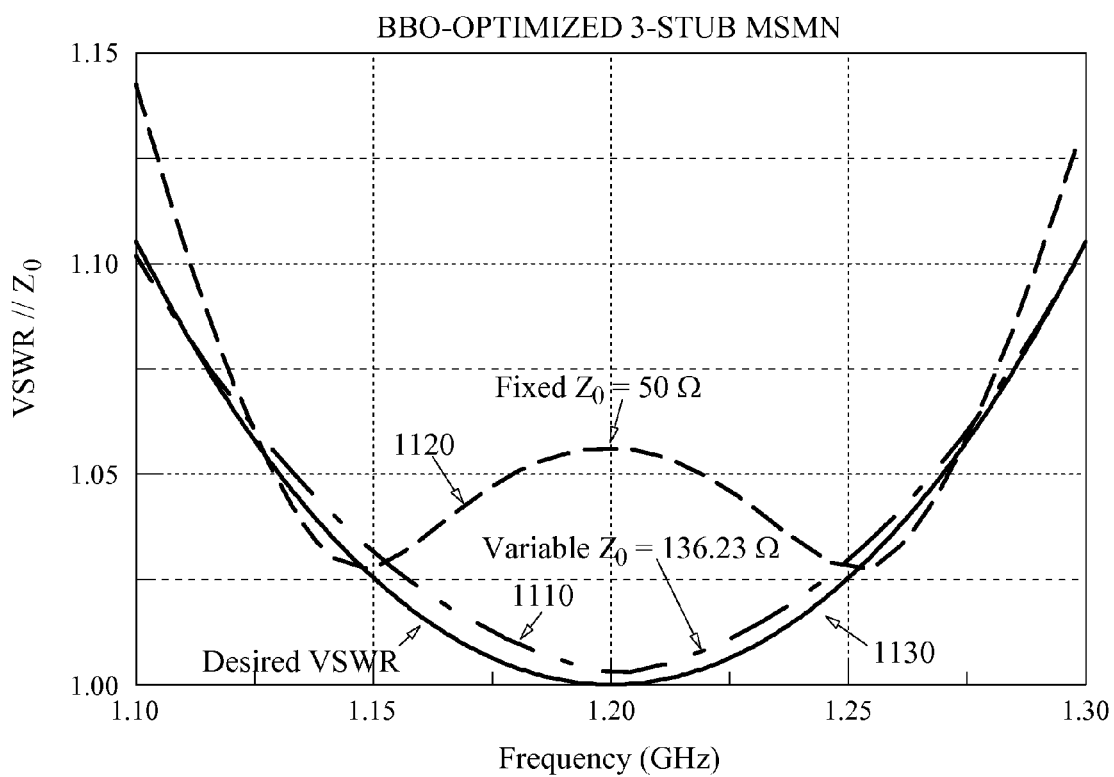
FIG. 11 is a graph of VSWR relative to $Z_0$ for a 3-Stub Multi-Stub Matching Network configured in accordance with an embodiment of this invention.
Figure 12:
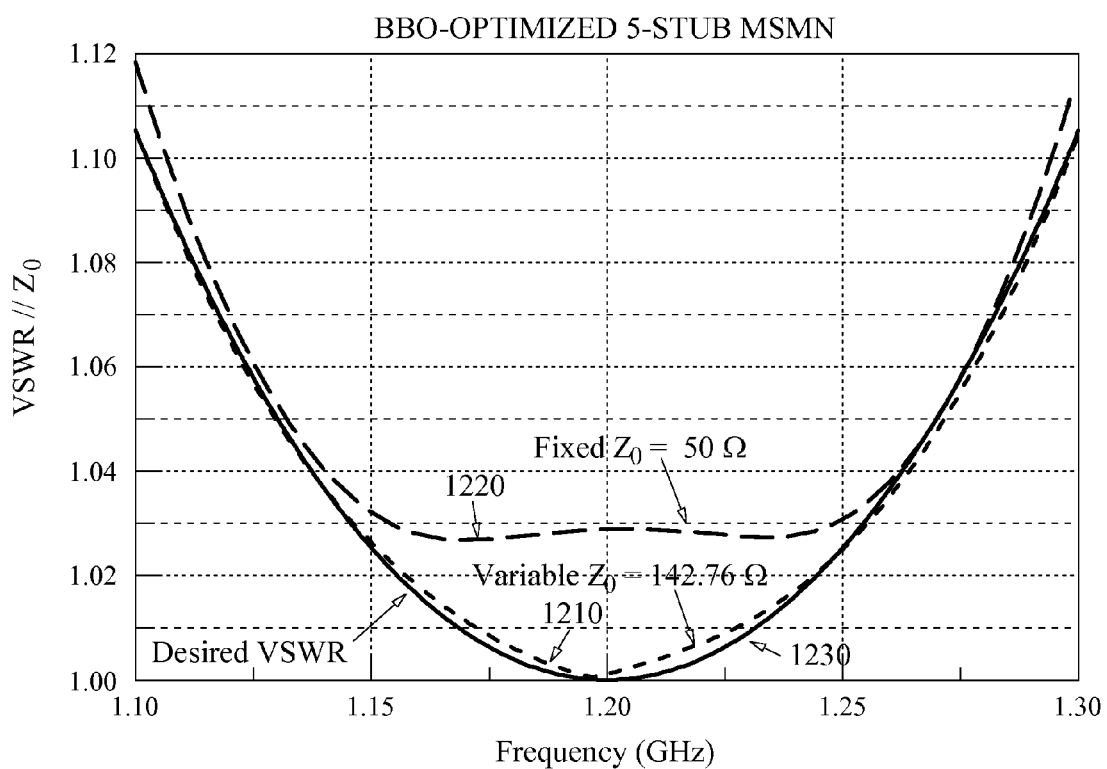
FIG. 12 is a graph of VSWR relative to $Z_0$ for a 5-Stub Multi-Stub Matching Network configured in accordance with an embodiment of this invention.
Figure 13:
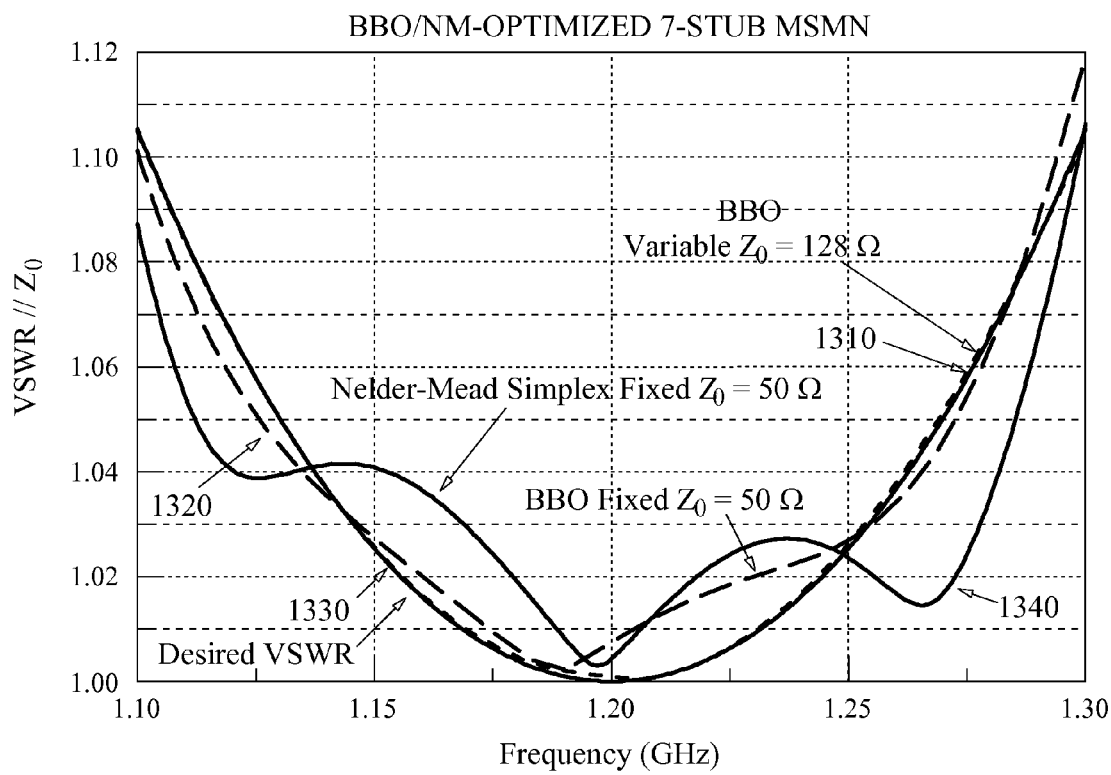
FIG. 13 is a graph of VSWR relative to $Z_0$ for a 7-Stub Multi-Stub Matching Network configured in accordance with an embodiment of this invention.

As a further example of Variable $Z_0$'s effectiveness, FIGS. 11, 12 and 13, graphs 1100, 1200 and 1300, respectively, show VSWR plots for 3, 5 and 7-stub Multi-Stub Matching Networks (MSMN) optimized for a specific VSWR profile (not a "flat" VSWR as in the previous examples) using both traditional D/O methodology in which $Z_0$ is fixed, and also using the Variable $Z_0$ System and Method according to this invention in which $Z_0$ "floats." The network comprises matching stubs on a transmission line whose characteristic impedance is $Z_0$. Biogeography Based Optimization (BBO) was used for each case with and without Variable $Z_0$, and for comparison the 7-stub MSMN also was optimized using Nelder-Mead Simplex (NM) with fixed-$Z_0$ only. The "standard" value $Z_0$=50Ω was used for all of the fixed-$Z_0$ runs. In order to compare the optimized MSMN configurations to an "ideal" response, graphs 1100, 1200, and 1300 include the desired VSWR curve as a solid line, 1130, 1230, 1330, which unlike in the Yagi and MM examples is not flat at VSWR=1. Discussion of the MSMN problem generally, and details of the design objective, appear in C. Regoli, "Impedance matching by using a multi-stub system," *Proceedings of the 7th WSEAS International Conference on Simulation, Modeling and Optimization*, Beijing, China, Sep. 15-17, 2007, pp. 340-344, which is fully incorporated herein by reference.

FIG. 11 shows results for the 3-stub MSMN. The BBO-optimized fixed $Z_0$ device exhibits especially poor VSWR performance 1120 near the band-center frequency of 1.2 GHz, whereas the BBO-optimized Variable $Z_0$ MSMN's response 1110 comes quite close to the desired response 1130. A similarly impressive improvement is seen in the 5-stub case, FIG. 12, graph 1200, wherein the fixed $Z_0$ device's VSWR 1220 is very poor mid-band, whereas in marked contrast the Variable $Z_0$ device's response 1210 is surprisingly close to the desired response 1230 throughout the entire band.

FIG. 13, graph 1300, compares two fixed-$Z_0$ 7-stub MSMNs optimized with BBO and with NM to the 7-stub network BBO-optimized using the Variable $Z_0$ System and Method according to this invention. Neither of the fixed-$Z_0$ responses, 1320 and 1340, is close to the desired response 1330 across the band spanning 1.1-1.3 GHz band, although both the BBO and NM devices slightly improve the mid-band response, with BBO 1320 performing better than NM 1340. However, even with this minor mid-band improvement, the overall response of the traditionally-optimized 7-stub device at best is only fair. In marked contrast, and what is nothing less than a truly unexpected and remarkable improvement, the BBO-optimized Variable $Z_0$ 7-stub MSMN response 1310 is essentially indistinguishable from the desired response 1330 across the entire band.

Because in the Variable $Z_0$ System and Method according to this invention the value of $Z_0$ is determined by the design or optimization methodology, the curves in FIGS. 11, 12 and 13 are annotated with the different BBO-determined $Z_0$ values, all of which are within a factor of 3 of "standard" fixed-$Z_0$ value of 50Ω that was employed in the traditional D/O methodology. For the 7-stub case, the optimal value of $Z_0$ is 128Ω, which happens to be fairly close to the 50Ω value that results in far worse VSWR performance. These results are a compelling example of how much better antenna systems designed using Variable $Z_0$ according to this invention can be, compared to traditionally designed or optimized systems.

The MSMN problem again illustrates how effective the Variable $Z_0$ System and Method is for solving difficult antenna system problems that simply cannot be effectively addressed by other methods. Additional details describing the MSMN problem appear in N. I. Dib, A. Sharaqa, and R. A. Formato, "Variable $Z_0$ Applied to Biogeography Based Optimized Multi-Stub Matching Network and to a Central Force Optimized Meander Monopole," April, 2012, which is fully incorporated herein by reference.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure. Other and various embodiments will be readily apparent to those skilled in the art, from this description, figures, and the claims that follow. It is intended that the scope of the invention be limited not by this detailed description, but rather by the claims appended hereto.

I claim:

1. A method of designing an antenna connected to a feed system including a radio frequency source, the method comprising:
   choosing minimum and maximum feed system characteristic impedance values;
   using an iterative antenna design algorithm on a computer where antenna design parameters and a feed system characteristic impedance value are variables to achieve one or more antenna performance objectives;
   varying said antenna design parameters while varying feed system characteristic impedance values between the minimum and maximum feed system characteristic impedance values until said one or more antenna performance objectives are achieved using said iterative antenna design algorithm;

determining a feed system characteristic impedance value from the varied feed system characteristic impedance values which results in said one or more antenna performance objectives;

designing the feed system such that said feed system exhibits said determined feed system characteristic impedance value or an approximation of said feed system characteristic impedance value;

determining which antenna design parameters result in said antenna performance objectives; and designing the antenna according to said determined antenna design parameters to achieve said one or more antenna performance objectives.

2. The method of claim 1 in which said antenna design parameters include antenna element length, diameter, and/or spacing; and/or helix diameter, turn pitch, wire gauge, and/or the number of turns.

3. The method of claim 1 in which varying the antenna design parameters include varying the antenna design parameters between maximum and minimum values.

4. The method of claim 1 in which said one or more antenna performance objects are input into the iterative antenna design algorithm.

5. The method of claim 1 in which said iterative antenna design algorithm includes Central Force Optimization, Dominating Cone Line Search, Particle Swarm Optimization, a Genetic Algorithm, Ant Colony Optimization, and/or Differential Evolution.

6. The method of claim 1 in which the feed system further includes a transmission line and/or a matching network and designing the feed system includes choosing a transmission line and/or matching network such that the feed system exhibits said determined feed system characteristic impedance value.

7. The method of claim 1 in which said antenna performance objectives include voltage standing wave ratio, gain, and/or Front-to-Back ratio.

8. The method of claim 1 in which the determined feed system characteristic impedance value is within a factor of three of a standard fixed antenna feed system characteristic impedance value.

* * * * *